United States Patent
Osinski et al.

(10) Patent No.: US 11,349,279 B2
(45) Date of Patent: May 31, 2022

(54) OPTICALLY COOLED PLATFORM FOR THERMAL MANAGEMENT APPLICATIONS

(71) Applicant: STC.UNM, Albuquerque, NM (US)

(72) Inventors: Marek Osinski, Albuquerque, NM (US); Alexander Neumann, Albuquerque, NM (US); Gennady A. Smolyakov, Albuquerque, NM (US)

(73) Assignee: UNM Rainforest Innovations, Albuquerque, NM (US)

(*) Notice: Subject to any disclaimer, the term of this patent is extended or adjusted under 35 U.S.C. 154(b) by 103 days.

(21) Appl. No.: 16/775,200

(22) Filed: Jan. 28, 2020

(65) Prior Publication Data

US 2020/0244038 A1 Jul. 30, 2020

Related U.S. Application Data

(60) Provisional application No. 62/797,878, filed on Jan. 28, 2019.

(51) Int. Cl.
| | |
|---|---|
| *H01S 5/024* | (2006.01) |
| *H01S 5/34* | (2006.01) |
| *H01S 5/026* | (2006.01) |
| *H01S 5/347* | (2006.01) |
| *H01S 3/04* | (2006.01) |

(52) U.S. Cl.
CPC ........ *H01S 5/02469* (2013.01); *H01S 3/0408* (2013.01); *H01S 5/026* (2013.01); *H01S 5/341* (2013.01); *H01S 5/347* (2013.01); *H01S 5/3412* (2013.01)

(58) Field of Classification Search
CPC .... H01S 3/0408; H01S 5/02469; H01S 5/026; H01S 5/341; H01S 5/3412; H01S 5/347
See application file for complete search history.

(56) References Cited

U.S. PATENT DOCUMENTS

| | | | |
|---|---|---|---|
| 6,903,364 B1 * | 6/2005 | Takayama | B82Y 20/00 257/103 |
| 2009/0225804 A1 * | 9/2009 | Sasahata | B82Y 20/00 372/45.01 |
| 2014/0126597 A1 * | 5/2014 | Strittmatter | H01S 5/341 372/44.01 |
| 2017/0317473 A1 * | 11/2017 | Liang | H01S 3/2375 |

OTHER PUBLICATIONS

[Adachi 2007] S.Adachi, "Lattice thermal conductivity of group-IV and III-V semiconductor alloys", *J. Appl. Phys.* 102 (#6), Art 063502, Sep. 15, 2007.

[Arcari 2014] M. Arcari, I. Söllner, A. Javadi, S. Lindskov Hansen, S. Mahmoodian, J. Liu, H. Thyrrestrup, E. H. Lee, J. D. Song, S. Stobbe, and P. Lodahl, "Near-unity coupling efficiency of a quantum emitter to a photonic crystal waveguide", *Phys. Rev. Lett.* 113 (#9), Art 093603, Aug. 29, 2014.

[Boriskina 2016] S. V. Boriskina, J. K. Tong, W. C. Hsu, B. L. Liao, Y. Huang, V. Chiloyan, and G. Chen, "Heat meets light on the nanoscale", *Nanophotonics* 5 (#1), pp. 134-160, Jun. 2016.

(Continued)

*Primary Examiner* — Michael Carter
(74) *Attorney, Agent, or Firm* — Keith Vogt, Ltd.; Keith A. Vogt

(57) ABSTRACT

A semiconductor device comprising a waveguide having a core, said core having inserted therein one or more layers of nanoemitters.

8 Claims, 7 Drawing Sheets

(56) References Cited

OTHER PUBLICATIONS

[Fernee 2007] M. J. Ferne, P. Jensen, and H. Rubinsztein-Dunlop, "Unconventional photoluminescence upconversion from PbS quantum dots", *Appl. Phys. Lett.* 91 (#4), Art 043112, 2007.

[Fujita 2005] M. Fujita, S. Takahashi, Y. Tanaka, T. Asano, and S. Noda, "Simultaneous inhibition and redistribution of spontaneous light emission in photonic crystals", *Science* 308, pp. 1296-1298, 2005.

[Geissler 2017] D. Geissler, C. Wurth, C. Wolter, H. Weller, U. Resch-Genger, "Excitation wavelength dependence of the photoluminescence quantum yield and decay behavior of CdSe/CdS quantum dot/quantum rods with different aspect ratios", *Phys. Chem. Chem. Phys.* 19 (#19), pp. 12509-12516, May 2017.

[Gordon 1991] R. Gordon, D. Hoffman, and U. Riaz, "Atmospheric pressure chemical vapor deposition of aluminum nitride thin films at 200-250 ° C.", *J. Mater. Res.* 6(# 1), pp. 5-7, 1991.

[Harbold 2007] J. M. Harbold and F. W. Wise, "Photoluminescence spectroscopy of PbSe nanocrystals", *Phys. Rev. B* 76 (#12), Art. 125304, Sep. 2007.

[Hassani Nia 2016] I. Hassani Nia, M. Rezaei, R. Brown, S. J. Jang, A. Turay, V. Fathipour, and H. Mohseni, "Efficient luminescence extraction strategies and anti-reflective coatings to enhance optical refrigeration of semiconductors", *J. Lumin.* 170, Pt 3, pp. 841-854, Feb. 2016.

[Hoffman 1996] D. M. Hoffman, S. P. Rangarajan, S. D. Athavale, D. J. Economou, J. R. Liu, Z. S. Zheng, W. K. Chu, "Chemical vapor deposition of aluminum and gallium nitride thin films from metalorganic precursors", *J. Vac. Sci. Technol. A*. 14 (#2), pp. 306-311, 1996.

[Iqbal 2018] A. Iqbal, F. Mohd-Yasin, "Reactive sputtering of aluminum nitride (002) thin films for piezoelectric applications: a review", *Sensors* 18(#6), Art. 1797, Jun. 2018.

[Jhansirani 2016] K. Jhansirani, R. S. Dubey, M. A. More, S. Singh, "Deposition of silicon nitride films using chemical vapor deposition for photovoltaic applications", *Results in Physics* 6, pp. 1059-1063, 2016.

[Kelly 2000] P. J. Kelly and R. D. Arnell, "Magnetron sputtering: a review of recent developments and applications," *Vacuum* 56(#3), pp. 159-172, Mar. 2000.

[La Spina 2006] L. La Spina, H. Schellevis, N. Nenadovic, and L. K. Nanver, "PVD aluminium nitride as heat spreader in silicon-on-glass technology", *Proc. IEEE MIEL*, 2006, pp. 365-368.

[Li 2014] D. H. Li, J. Zhang, X. J. Wang, B. L. Huang, and Q. H. Xiong, "Solid-state semiconductor optical cryocooler based on CdS nanobelts", *Nano Lett.* 14 (#8), pp. 4724-4728, Aug. 2014.

[Martynenko 2018] I. V. Martynenko, A. S. Baimuratov, V. A. Osipova, V. A. Kuznetsova, F. Purcell-Milton, I. D. Rukhlenko, A. V. Fedorov, Y. K. Gun'ko, U. Resch-Genger, A. V. Baranov, "Excitation energy dependence of the photoluminescence quantum yield of core/shell CdSe/CdS quantum dots and correlation with circular dichroism", *Chem. Mater.* 30(#2), pp. 465-471, Jan. 2018.

[Men 2008] C. Men, C. L. Lin, "Characterization of bonded silicon-on-aluminum-nitride wafers with RBS, TEM and HRXRD techniques", *Microelectron. Eng.* 85 (#8), pp. 1807-1810, Aug. 2008.

[Miller 2017] D. A. B. Miller, "Attojoule optoelectronics for low-energy Information processing and communications", *J. Lightwave Technol.* 35 (#3), pp. 346-396, Feb. 1, 2017.

[Nemova 2010] G. Nemova and R. Kashyap, "Laser cooling of solids", *Rep. Progr. Phys.* 73 (#8), Art 086501, 2010.

[Nemova 2012] G. Nemova and R. Kashyap, "Laser cooling with PbSe colloidal quantum dots", *J. Opt. Soc. Am. B* 29 (#4), pp. 676-682, Apr. 2012.

[Noda 2007] S. Noda, M. Fujita, and T. Asano, "Spontaneous-emission control oy photonic crystals and nanocavities", *Nature Photon.* 1 (#8), pp. 449-458, Aug. 2007.

[Poles 1999] E. Poles, D. C. Seimarten, O. I. Mićić, and A. J. Nozik, "Anti-Stokes ohotoluminescence in colloidal semiconductor quantum dots", *Appl. Phys. Lett.* 75 (#7), pp. 971-973, Aug. 16, 1999.

[Rakovich 2002a] Y. P. Rakovich, S. A. Filonovich, M. J. M. Gomes, J. F. Donegan, D. V. Talapin, A. L. Rogach, and A. Eychmiiller, "Anti-Stokes photoluminescence in II-VI colloidal nanocrystals", *Phys. Stat. Sol. B* 229 (#1), pp. 449-452, Jan. 2002.

[Rakovich 2002b] Y. P. Rakovich, A. A. Gladyshchuk, K. I. Rusakov, S. A. Filonovich, M. J. M. Gomes, D. V. Talapin, A. L. Rogach, and A. Eychmiiller, "Anti-Stokes luminescence of cadmium telluride nanocrystals", *J Appl. Spectrosc.* 69 [#3], pp. 444-449, May-Jun. 2002.

[Rakovich 2009] Y. P. Rakovich, J. F. Donegan, M. I. Vasilevskiy, and A. L. Rogach, "Anti-Stokes cooling in semiconductor nanocrystal quantum dots: A feasibility study", *Phys. Status Solidi A* 206 (#11), pp. 2497-2509, Nov. 2009.

[Refractive index.INFO 2018] https://refractiveindex.info/?shelf=main&book=AlN&page=Kischkat.

[Rusakov 2003] K. l. Rusakov, A. A. Gladyshchuk, Y. P. Rakovich, J. F. Donegan, S. A. Filonovich, M. J. M. Gomes, D. V. Talapin, A. L. Rogach, and A. Eychmüller, "Control of efficiency of photon energy up-conversion in CdSe/ZnS quantum lots", *Opt. Spectr.* 94 (#6), pp. 859-863, Jun. 2003.

[Wang 2003] X. Y. Wang, W. W. Yu, J. Y. Zhang, J. Aldana, X. G. Peng, and M. Xiao, "Photoluminescence upconversion in colloidal CdTe quantum dots", *Phys. Rev. B* 68 (#12), Art 125318, Sep. 15, 2003.

[Xiong 2017] Y. Xiong, C. Liu, J. Wang, J. J. Han, and X. J. Zhao, Near-infrared anti-Stokes 2017.

[Zhang 2013] J. Zhang, D. H. Li, R. J. Chen, and Q. H. Xiong, "Laser cooling of a semiconductor by 40 kelvin", *Nature* 493 (#7433), pp. 504-508, Jan. 24, 2013.

[Zhang 2016] Q. Zhang, X. F. Liu, M. 1. B. Utama, G. C. Xing, T. C. Sum, and Q. H. Xiong, "Phonon-assisted anti-Stokes lasing in ZnTe nanoribbons", *Adv. Mater.* 28 (#2), pp. 276-283, Jan. 13, 2016.

[Zhong 2014] B. Zhong, Y. H. Jia, L. Chen, Y. C. Deng, Y. Q. Chen, and J. P. Yin, "Cavity-enhanced laser cooling for $Yb^{3+}$-doped fluoride crystal using a low-power diode laser", *J. Opt. Soc. Am. B* 31 (#9), pp. 2116-2120, Sep. 2014.

[Zhu 2010] X. Zhu and N. Peyghambarian, "High-power ZBLAN glass fiber lasers: Review and prospects", *Adv. OptoElectron.* 2010, Art 501956, 2010.

\* cited by examiner

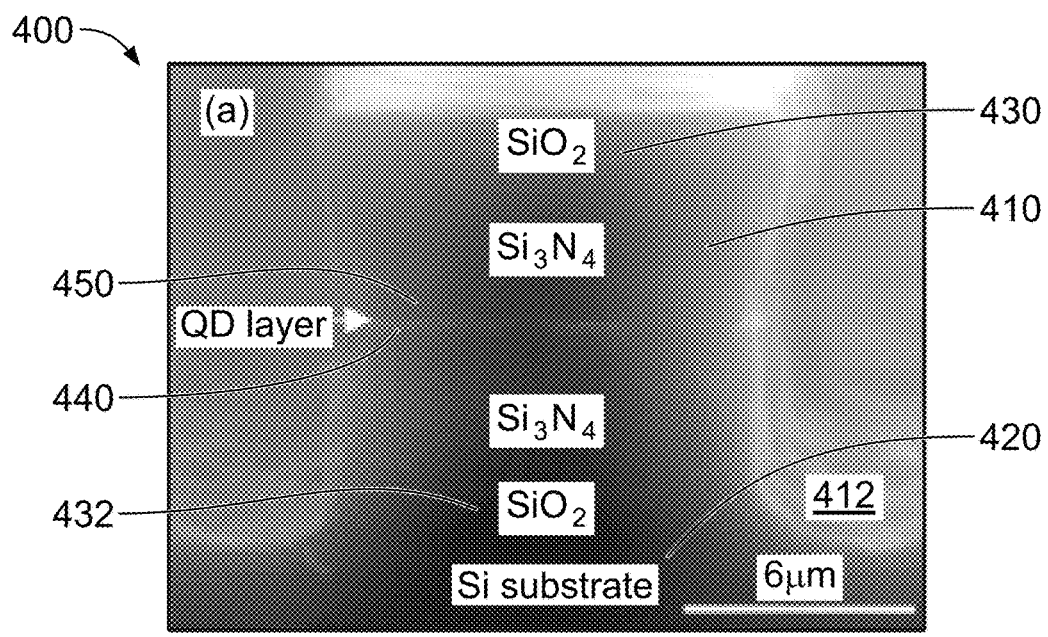
FIG. 4A
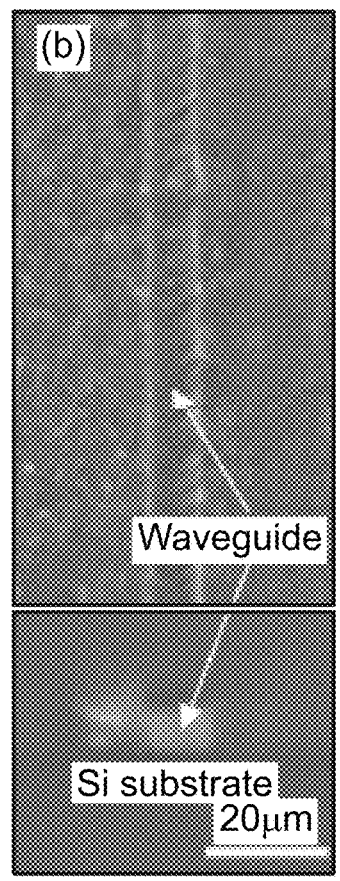 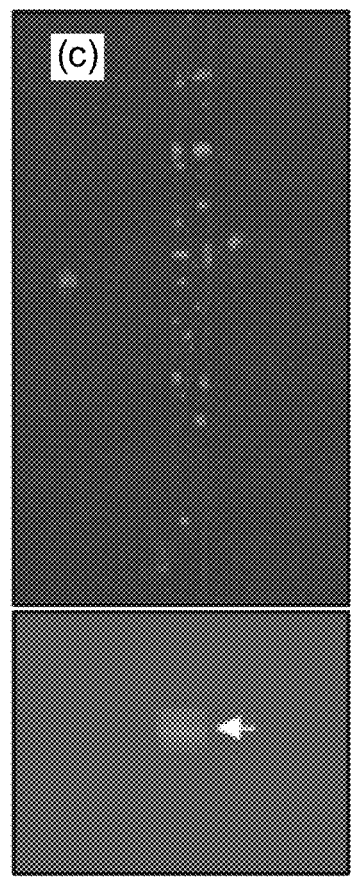
FIG. 4B FIG. 4C

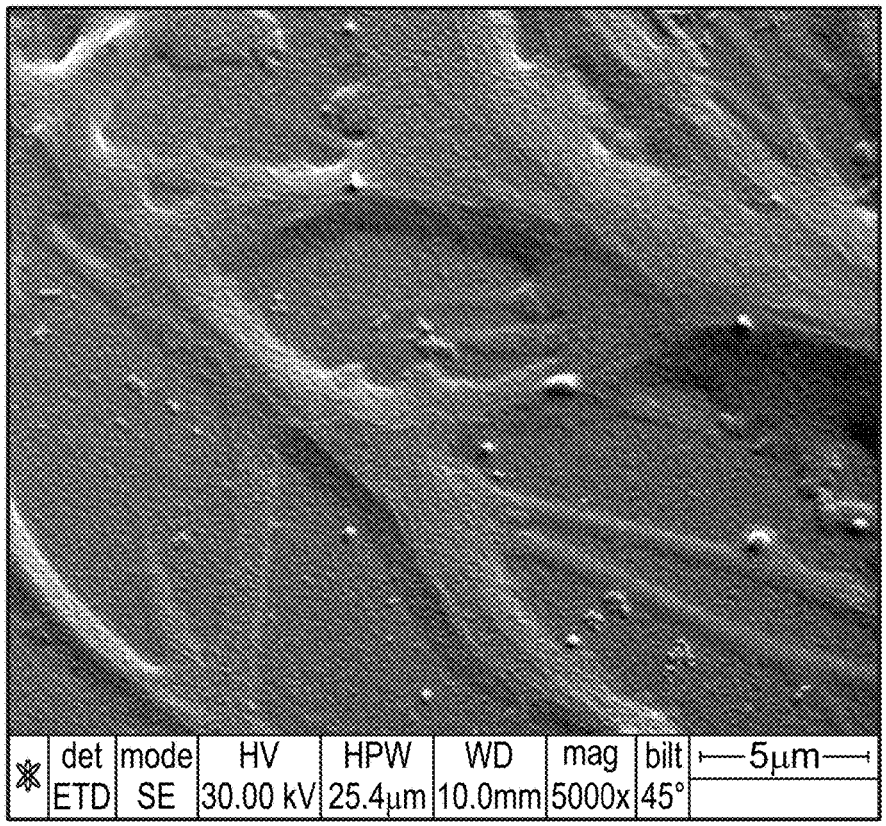
FIG. 5
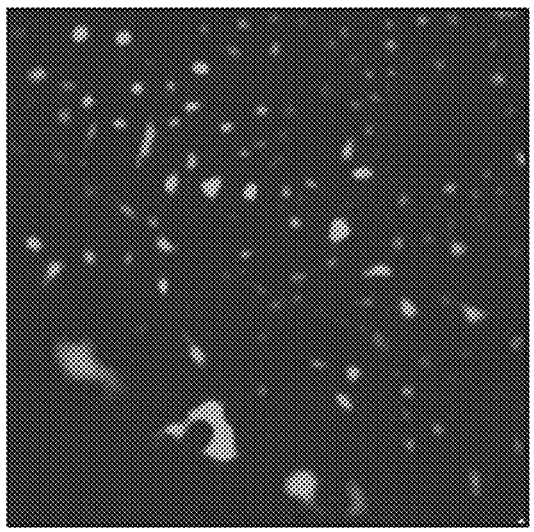 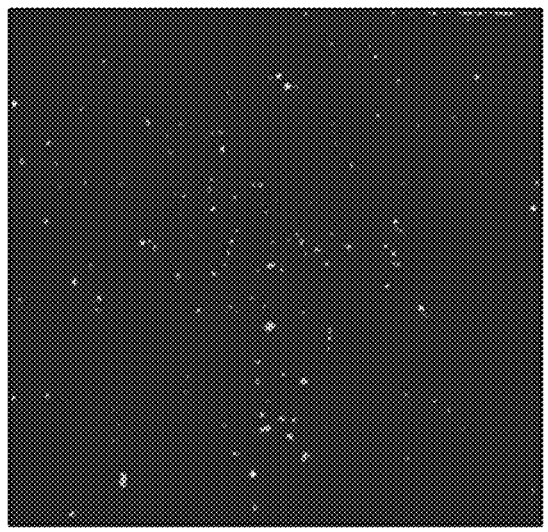
FIG. 6          FIG. 7

OPTICALLY COOLED PLATFORM FOR THERMAL MANAGEMENT APPLICATIONS

RELATED APPLICATIONS

This application claims priority to U.S. Provisional Application Ser. No. 62/797,878 filed Jan. 28, 2019, which is incorporate herein in its entirety by reference.

STATEMENT REGARDING FEDERALLY SPONSORED RESEARCH & DEVELOPMENT

This invention was made with government support under ONR Grant No. N00014-17-1-2975, ONR SBIR Contract No. N6833518C0317 awarded by Navy/Office of Naval Research. The government has certain rights in the invention

INCORPORATION BY REFERENCE OF MATERIAL SUBMITTED ON A COMPACT DISC

Not applicable.

FIELD OF THE INVENTION

The present invention relates to cooling devices and, in particular, to an optically cooled platform for thermal management applications in electronics, sensors, etc.

BACKGROUND OF THE INVENTION

The current exponential growth of energy consumption in supercomputers and data centers has become an ecological and economical problem for reasons such as power delivery, power dissipation, and heat removal. By putting constraints on the design of information processing machines, these energy-related aspects limit the ability to process and communicate information. To sustain the exponential growth in the use of information, the energy required to handle each bit needs to be reduced. This reduction, however, becomes an increasingly harder problem, despite the continuing progress in scaling down the logic devices.

An alternative approach could be to find radically new strategies for the more efficient cooling of electronics. In particular, drastically new strategies are highly desirable for cooling 3D stacks of electronics, where power dissipation and heat removal becomes the most severe problem due to the difficulty in designing effective heat sinks of suitable geometry. The concept of optical refrigeration or laser cooling of solids may provide a means for implementation of such heat sinks as optically-cooled thermal ground planes compatible with 3D stacks of electronics.

Ordinarily, the process of optical excitation and emission in solids results in heat generation in the medium. This is a fundamental effect caused by the Stokes energy shift between the higher-energy pump photons and the lower-energy output photons, often called the quantum defect. In optical refrigeration or laser cooling, radiation cooling is achieved by anti-Stokes fluorescence within the medium that overcomes the heat generated by the Stokes-shifted fluorescence.

A laser cooling cycle in a solid is illustrated in FIG. 1. The upper and lower electronic levels (manifolds) are split into many closely spaced sublevels (energy bands in the case of semiconductor materials). Pump photons at the longer-wavelength side of the absorption spectrum with the energy $hv_p$ excite the lower-energy electronic transitions from the ground state to the excited state. The excited ions in a host matrix (or charge carriers in a semiconductor material) exchange energy with phonons during the thermalization process and reach quasi-equilibrium with the lattice. Fluorescence then follows with mean photon energy $hv_f$ higher than that of the originally absorbed photon, thus removing energy from the sample.

An essential condition for achieving laser cooling in solids is a low non-radiative recombination rate and availability of a high-quantum-efficiency anti-Stokes transition. It is equally important that the anti-Stokes spontaneous emission escapes the material without trapping and reabsorption, which would cause re-heating of the sample. These requirements can be satisfied for rare-earth ions in hosts with low phonon energy and low refractive indexes of the host material, such as fluoride or chloride glasses and crystals. Poor heat conduction of glasses, however, makes them unsuitable for heat sink applications. The thermal conductivity of undoped glass is ~1.38 W/(m·K), and an even smaller number of ~0.628 W/(m·K) was reported for ZBLAN ($ZrF_4$—$BaF_2$—$LaF_3$—$AlF_3$—NaF), considered as the most stable heavy metal fluoride glass and the excellent host for rare-earth ions. In contrast to glasses, III-V compound semiconductors are characterized by much higher thermal conductivity: ~45 W/(m·K) for GaAs; ~68 W/(m·K) for InP; ~36 W/(m·K) for GaSb, and exceptionally high ~319 W/(m·K) for AlN. In semiconductors, however, problems with the realization of laser cooling include relatively high nonradiative recombination rates, the low extraction efficiency of spontaneous emission due to the total internal reflection, and the reabsorption effect. The laser cooling of semiconductors has been attempted for decades in III-V semiconductor quantum wells without success. Significant breakthroughs have been recently reported by using II-VI, rather than III-V, nanomaterials. In particular, laser cooling by 40 K has been observed in II-VI CdS nanoribbons and by 30 K in CdS nanobelts.

Very intense phonon-assisted anti-Stokes photoluminescence and even lasing has recently been reported in ZnTe nanoribbons. The net laser cooling in those II-VI materials was attributed to strong coupling between excitons and longitudinal optical phonons (LOPs) that allowed the resonant annihilation of multiple LOPs in the luminescence up-conversion processes, high external quantum efficiency, and negligible background absorption. These II-VI materials are very promising for the development of cooling semiconductor devices.

As mentioned above, a significant challenge that needs to be addressed in the laser cooling of semiconductor materials is the photoluminescence trapping and the consequent photon recycling. Effective strategies to reduce photon trapping are needed to assist cooling. Photons are trapped inside a material due to the total internal reflection. The escape cone for a boundary between a bulk material with the refractive index n and air is equal to $2n^2 4\pi$ steradians, which leads to an extraction efficiency of $\sim 1/2n^2$. The index and the size of the structure determine the amount of the power radiated out of the material—the higher the index and size of the material the higher the localization of the optical mode inside the material. This simple formula predicts a very low extraction efficiency of ~5.5% for semiconductors with a refractive index of 3, not usually sufficient for laser cooling purposes. Therefore, it is very desirable to find a strategy for the directional extraction of spontaneous emission out of the cooling device.

For the full directional control of the spontaneous emission in a cavity to be realized, all the spontaneous emission events must couple spatially into the guided modes. In other words, a spontaneous emission pattern that emits solely into the guided modes is desired, which requires the minimization of spontaneous emission into the radiation modes. This can be achieved by the unique capability of photonic crystals (PhCs) to control spontaneous emission due to the photonic bandgap (PBG) effect, not attainable in conventional dielectric-waveguide-based cavities.

Spontaneous-emission control by 2D PhCs has been demonstrated. It has been shown that the overall spontaneous emission rate can be substantially reduced by the 2D PBG, while the efficiency of light emission in a direction not constrained by the PhC can be significantly enhanced. This result clearly demonstrates that when spontaneous emission is inhibited by the 2D PBG effect in a certain direction (and thus the excited carriers are forbidden to recombine by emitting spontaneous photons in that direction), the carriers are eventually used by emitting spontaneous photons in other directions. This effect was referred to as 'the inhibition of spontaneous emission and the redistribution of the saved energy'.

BRIEF SUMMARY OF THE INVENTION

In one embodiment, the present invention provides an optical cooling device comprising an optical dielectric waveguide with single or multiple layers of nanoemitters inserted into the waveguide particularly at the core.

In one embodiment, the present invention provides an optical cooling device comprising an optical dielectric waveguide with single or multiple layers of quantum wells, wires or dots inserted into the waveguide particularly at the core.

In another embodiment, the present invention provides an optical cooling device wherein the materials of the optical waveguide are characterized by very high thermal conductivity and the waveguide structure can serve as an effective heat sink for active electronic components co-fabricated with the cooling device.

In another embodiment, the present invention provides an optical cooling device wherein the nanoemitters or quantum-well layers are grown in any semiconductor material system with high efficiency of anti-Stokes photoluminescence.

In another embodiment, the present invention provides an optical cooling device wherein the nanoemitters or quantum-well layers are optically pumped by the external laser emission and provide optical cooling.

In another embodiment, the present invention provides an optical cooling device wherein the external pumping light is supplied to the cooling device through a properly aligned and rigidly attached optical coupling device and the light output is collected into an outcoupling device attached to the other end of the cooling device waveguide.

In another embodiment, the present invention provides an optical cooling device wherein the core of the waveguide is made of $Si_3N_4$ and the cladding layers are made of aluminum nitride (AlN).

In another embodiment, the present invention provides an optical cooling device integrated into a cooling plane.

In another embodiment, the present invention provides an optical cooling device wherein the optical waveguide is implemented in a two-dimensional photonic-crystal waveguide platform as a slab photonic-crystal waveguide.

In another embodiment, the present invention provides an optical cooling device wherein the slab photonic-crystal waveguide is fabricated in cubic, hexagonal, or other complex photonic lattices and terminated with mirror facets.

In another embodiment, the present invention provides an optical cooling device integrated into a cooling plane resulting in a cooling semiconductor plane structure that can be co-fabricated with a layer of active electronic components being cooled.

In another embodiment, the present invention provides an optical cooling device wherein the cooling plane structures are organized into a three-dimensional stack of optically cooling planes with layers of active electronic components cooled in between.

In another embodiment, the present invention provides an optical cooling device wherein the photonic-crystal cooling plane structures are organized into a three-dimensional stack of photonic-crystal optically cooling planes with layers of active electronic components cooled in between.

In another embodiment, the present invention provides an optical cooling device wherein the waveguide structure can be of any geometry, including cylindrical waveguide or conventional optical fiber.

In another embodiment, the present invention provides an optical cooling device wherein nanoemitters are fabricated as quantum-well, quantum-dot or quantum-wire layers.

In another embodiment, the present invention provides an optical cooling device wherein nanoemitters are inserted into the waveguide core by applying a drop of quantum dot solution to the surface of the prefabricated half-core layer, letting it dry, and growing the rest of the dielectric waveguide structure.

In another embodiment, the present invention provides an optical cooling device wherein nanoemitters are inserted into the waveguide core by spin-coating quantum dot solution on the surface of the prefabricated half-core layer and growing the rest of the dielectric waveguide structure.

In another embodiment, the present invention provides an optical cooling device wherein nanoemitters are inserted into the waveguide core by first making a matrix of two-dimensional holes into the surface of the prefabricated half-core layer and then by spin-coating a layer of quantum dot solution.

In another embodiment, the present invention provides an optical cooling device wherein the matrix is prepared by spin-coating a monolayer of nanospheres, such as $SiO_2$ nanoparticles.

In another embodiment, the present invention provides a semiconductor device including a plurality of waveguides in contact with one or more layers of active electronic components.

In another embodiment, the present invention provides a semiconductor device including a plurality of waveguides configured into one or more three-dimensional stacks of optically cooling planes with layers of active electronic components being cooled in between.

In another embodiment, the present invention provides a semiconductor device including an optical waveguide that is implemented in a two-dimensional photonic-crystal waveguide platform as a slab photonic-crystal waveguide.

In another embodiment, the present invention provides a semiconductor device including a plurality of waveguides, the plurality of optical waveguides implemented in a plurality of two-dimensional photonic-crystal waveguide platforms and the plurality of two-dimensional photonic-crystal waveguide platforms are arranged as three-dimensional stacks of photonic-crystal optically cooling planes with layers of active electronic components being cooled in between.

In another embodiment, the present invention provides a luminescent thermometry method of relative temperature measurements in laser cooling experiments where laser the cooling or heating effect correlate with a phase change, registered by a lock-in amplifier, of fluorescence signal relative to probe signal being in anti-phase with pump signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

In the drawings, which are not necessarily drawn to scale, like numerals may describe substantially similar components throughout the several views. Like numerals having different letter suffixes may represent different instances of substantially similar components. The drawings illustrate generally, by way of example, but not by way of limitation, a detailed description of certain embodiments discussed in the present document.

FIG. 4A is a cross-sectional SEM image of a waveguide with a QD layer in the middle of the $Si_3N_4$ core for an embodiment of the present invention.

FIGS. 4B and 4C are optical microscope images (left) and the fluorescence from the corresponding area at 450 nm excitation (right). Top and bottom panels are top-down and cross-sectional views respectively.

FIG. 5 is an SEM image of CdSeS/ZnS QDs spin-coated on $Si_3N_4$ at 200 rpm for 15 seconds for an embodiment of the present invention.

FIG. 6 illustrates CdSeS/ZnS QDs clusters fluorescence on the glass at an excitation wavelength of 457 nm for an embodiment of the present invention FIG. 7 illustrates CdSeS/ZnS QDs fluorescence on a layer of $SiO_2$ nanoparticles at an excitation wavelength of 457 nm for an embodiment of the present invention.

DETAILED DESCRIPTION OF THE INVENTION

Detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a representative basis for teaching one skilled in the art to variously employ the present invention in virtually any appropriately detailed method, structure or system. Further, the terms and phrases used herein are not intended to be limiting, but rather to provide an understandable description of the invention.

Cooling a semiconductor device using anti-Stokes photoluminescence presents many challenges. These include the requirements for the properties/quality of the material (such as high thermal conductivity, high efficiency of anti-Stokes luminescence, high external quantum efficiency, strong coupling between excitons and LOPs, and negligible background absorption) that are not easy to meet in one specific material.

In one aspect, the present invention provides an alternative concept of a cooling hybrid device, where nanosized emitters (nanoemitters) or quantum well (QW) layers, quantum dot (QD) layers, quantum wires grown in any semiconductor material system (including III-V, II-VI, or IV-VI semiconductors) with high efficiency of anti-Stokes photoluminescence are inserted into an optical waveguide structure made of a wider-bandgap thermally conducting material. The emitters may be optically pumped by the external laser emission and provide cooling, similar to the laser cooling scheme of rare-earth-doped glasses optically pumped with external laser light. This embodiment of the present invention overcomes the known problem of very low absorption of the pump light in the latter scheme by putting the emitters inside a resonant cavity and, thus, employing the effect of cavity-enhanced absorption of the pump light.

Figure 1:
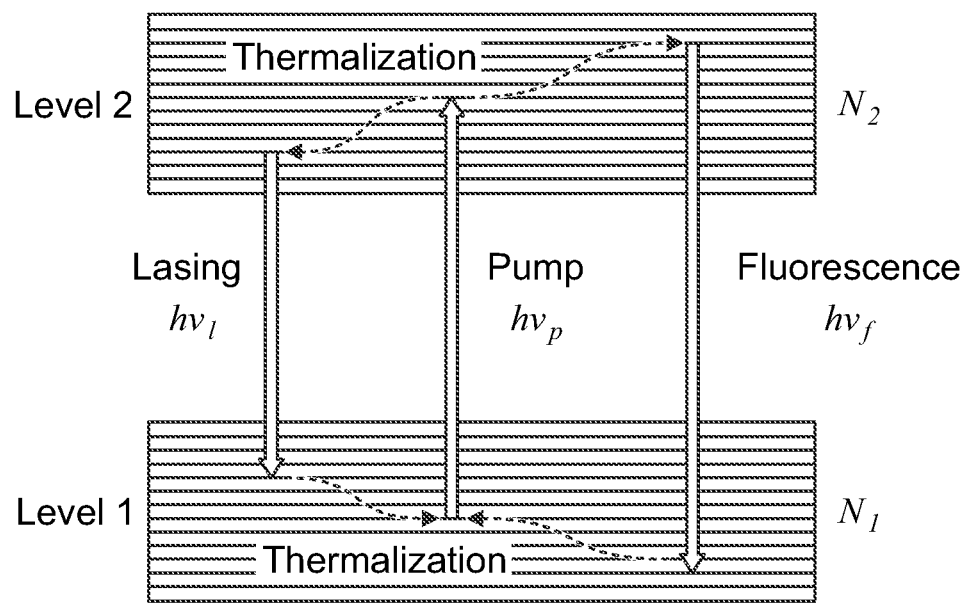
FIG. 1 illustrates an energy-level scheme for a radiation-balanced laser.
Figure 2:
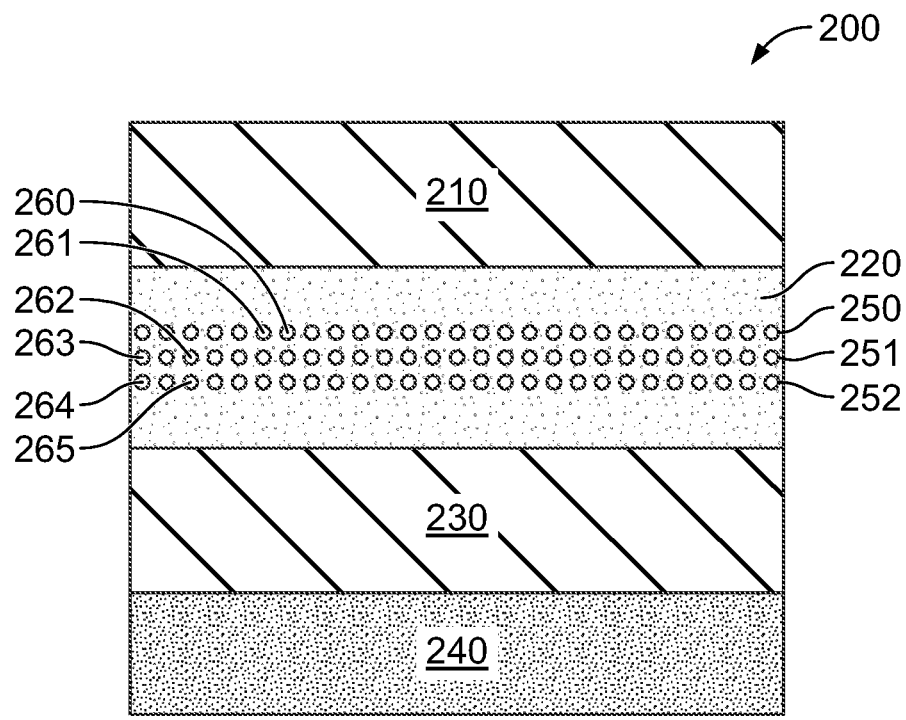
FIG. 2 illustrates a $SiO_2/AlN/Si_3N_4/AlN$-based waveguide structure with embedded QDs for an embodiment of the present invention.

The present invention, in an alternate embodiment, provides an optical cooling device in the form of an optical dielectric waveguide 200 that consists of an aluminum nitride (AlN) layer 210, $Si_3N_4$ layer 220 and an AlN layer 230 on a substrate 240 such as $SiO_2$. A plurality of layers 250, 251 and 252 may be inserted into the core $Si_3N_4$ waveguide layer 220 as shown in FIG. 2. As further shown, layers 250, 251 and 252 are comprised of a plurality of nanoemitters, quantum dots, quantum wells, or quantum wires 260-265.

The materials of the optical waveguide are characterized by very high thermal conductivity, and the waveguide structure will serve as an effective heat sink for active electronic components and active optical cooling plane applications.

The wide-bandgap materials of the optical waveguide of the present invention have very low background absorption over a very wide wavelength range. The optical and thermal properties (for polycrystalline forms) of the materials are shown in Table 1.

TABLE 1

Material properties of a prototype cooling device

| Material | κ, W/(m · K) | n at 532 nm | $E_g$, eV | λ at $E_g$, nm |
|---|---|---|---|---|
| $Si_3N_4$ | 30** | 2.026* | ~5 eV | 248 |
| AlN | 140-180** | 1.929* | ~6 eV | 206 |
| $SiO_2$ | 1.38 | 1.5 | ~8 eV | 155 |

AlN thin film deposition can be done by numerous techniques which include physical vapor deposition (PVD), chemical vapor deposition (CVD), and DC/RF reactive sputtering. CVD has been demonstrated for both AlN and Si$_3$N$_4$ thin films. In an alternate embodiment, the entire structure of the optical waveguide shown in FIG. 2 may be fabricated in one run using CVD on a SiO$_2$ substrate.

For enhanced directional extraction of spontaneous emission out of the cooling device, PhCs may be used to control spontaneous emission due to the 2D PBG effect, not attainable in conventional dielectric-waveguide-based cavities. When implemented in a 2D PhC-waveguide platform, the concept of cooling 2D PhC semiconductor devices may be realized as slab PhC waveguides fabricated e.g. in cubic photonic lattices and terminated with mirror facets. PhC waveguides can be formed by removing one or more rows of PhC air holes.

In all embodiments, the cooling performance may be achieved by extracting a substantial part of the anti-Stokes spontaneous emission of the embedded nanoemitters from the cavity. Anti-Stokes spontaneous luminescence caused by single-photon phonon-assisted carrier excitation may be achieved using InP, CdSe, CdTe, PbS, and PbSe quantum dots (QDs).

In active optical cooling applications, the external pumping light can be supplied to the cooling device through a properly aligned and rigidly attached output optical fiber of an external pigtailed semiconductor laser. Similarly, the light output can be collected into a fiber attached to the other end of the cooling device cavity.

The geometry of a single device allows for the fabrication of an array of such devices on a common substrate, thus making a cooling semiconductor plane structure that can be co-fabricated with a layer of active electronic components being cooled, for example, using a Si-on-AlN wafer-bonding process. Furthermore, the cooling plane structures such as optical waveguide 200 may be organized into a 3D stack of optically cooling planes with layers of active electronic components being cooled in between. In the case of a 3D stack of optically cooling planes, the waveguide structure of the cooling planes may be placed between multiple layers of active electronics components being cooled, which makes the substrate in FIG. 2 unnecessary.

The fabrication process for the cooling planes is compatible with CMOS technology. Moreover, the embodiments of the present invention are applicable to any waveguide structure, including cylindrical waveguide or conventional optical fiber.

FIG. 4A shows a cooling device that consists of a symmetric SiO$_2$/Si$_3$N$_4$/SiO$_2$ optical dielectric waveguide grown 400 on Si substrate 420 with layers of commercially available CdSeS/ZnS QDs 440 inserted into the middle of Si$_3$N$_4$ core 450 which is made of opposing layers 410 and 412. With the SiO$_2$ materials of the optical waveguide claddings 430 and 432 characterized by very high thermal resistivity, the optical cooling effect is created in the waveguide core with embedded QDs and detected by noncontact luminescent thermometry.

Figure 3A:
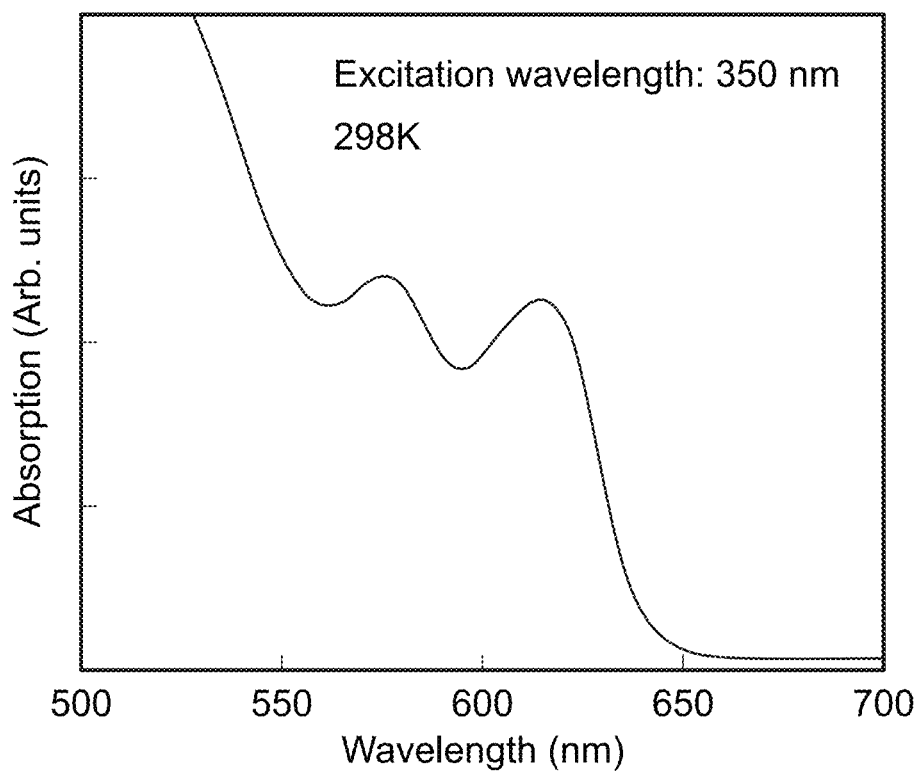
FIG. 3A depicts a room temperature absorption spectrum of CdSeS/ZnS QDs in hexane.
Figure 3B:
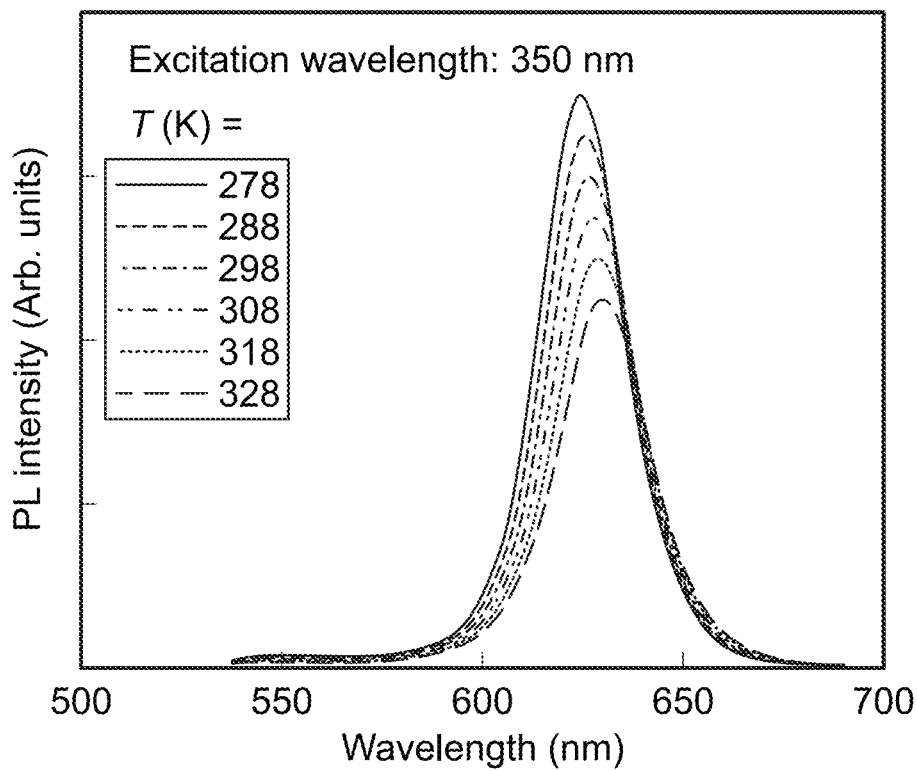
FIG. 3B shows temperature-dependent photoluminescence (PL) at 350 nm excitation of CdSeS/ZnS QDs in hexane.
Figure 3C:
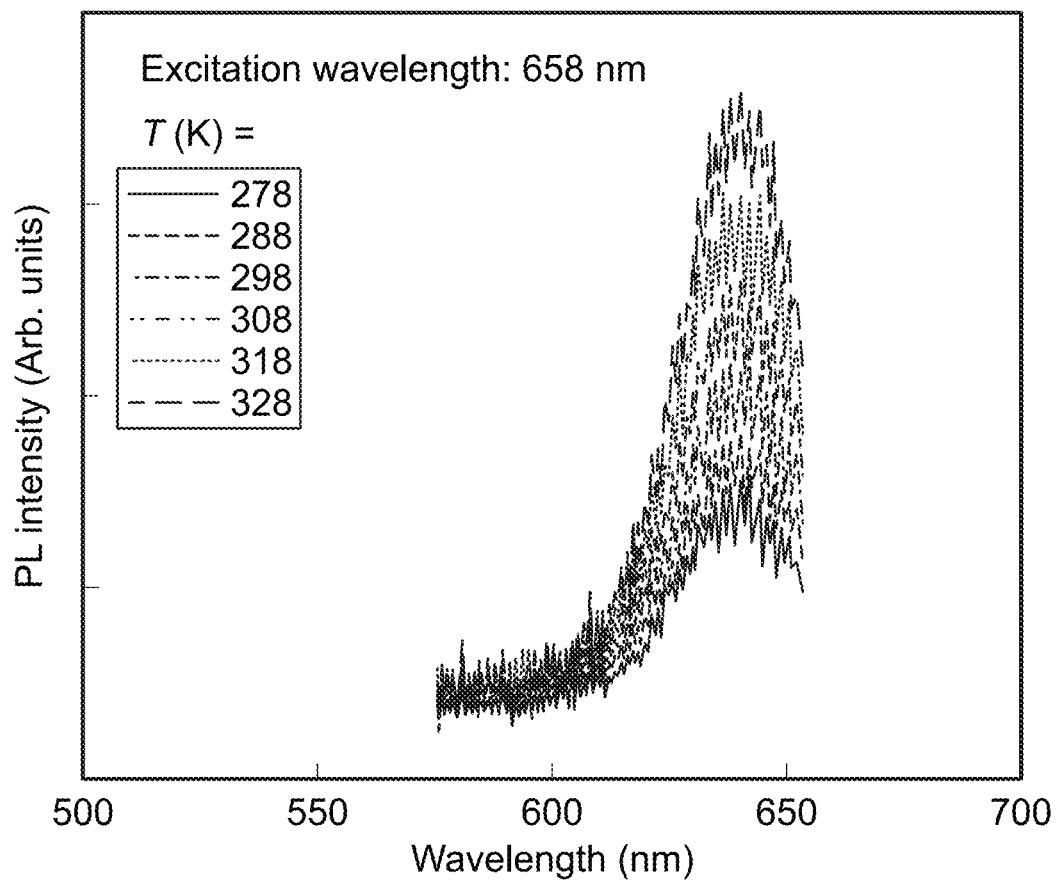
FIG. 3C shows temperature-dependent PL at 658 nm excitation of CdSeS/ZnS QDs in hexane.

CdSeS/ZnS QDs have been acquired with photoluminescence (PL) peak at 630 nm (FIG. 3B) and a double-peaked absorption at 575 nm and 615 nm near the bandgap edge (FIG. 3A) at room temperature corresponding to two closely spaced excitation levels in QDs, which is a necessary condition for anti-Stokes refrigeration. The QDs demonstrated relatively strong anti-Stokes PL as shown in FIG. 3C.

The layer structure for an 8-μm-wide waveguide was 1-μm SiO$_2$/6-μm Si$_3$N$_4$/1-μm SiO$_2$ on a Si substrate 420 as shown in FIG. 4. The total thickness was slightly greater than 8 μm. QD layer 440 was embedded in the middle of Si$_3$N$_4$ core 450. It consisted of CdSeS/ZnS QDs sandwiched by 20 nm-thick SiO$_2$ layers (not visible in the figure) which are expected to contribute to thermal insulation of the QDs from the Si$_3$N$_4$ core 450. After growing the bottom half structure of the waveguide, the sample was unloaded and was covered by the QD colloid and left in the atmospheric environment until the complete vaporization of hexane. Then, the sample was reloaded into the reactor and the top half of the waveguide was grown on it.

FIG. 5 is an SEM image of CdSeS/ZnS QDs that were spin-coated on the bottom half of the waveguide structure. After spin coating, the solvent of the colloidal solution (hexanes) was removed by its evaporation at room temperature under the atmospheric condition. With no patterning of the Si$_3$N$_4$ layer, the particles and clusters are randomly distributed on the surface. Further experiments with quantum dots showed that they tend to cluster on flat surfaces. The clusters' fluorescence is shown on a glass surface in FIG. 6. A rough surface is required to prevent the agglomeration of the quantum dots during the drying process. Fluorescence of individual CdSeS/ZnS quantum dots was achieved on a layer of 50-nm-diameter SiO$_2$ nanoparticles, as shown in FIG. 7. The embodiments of the present invention may be enhanced by optimization of the surface as well as colloidal concentration and spin rpm in coating for better uniformity.

Other techniques such as dip coating may be used to improve the spatial uniformity of the QDs if the agglomerated QDs interact. If they don't interact, their agglomeration presents no obstacle.

The optical cooling effect of the present invention has been demonstrated using a novel original version of the luminescent thermometry method of relative temperature measurements where laser cooling or heating effect correlated with a phase φ change of the fluorescence signal relative to the probe signal registered by a lock-in amplifier. It has been found that φ changing sign from positive to negative corresponded to local cooling effect induced by the pump laser.

Figure 8A:
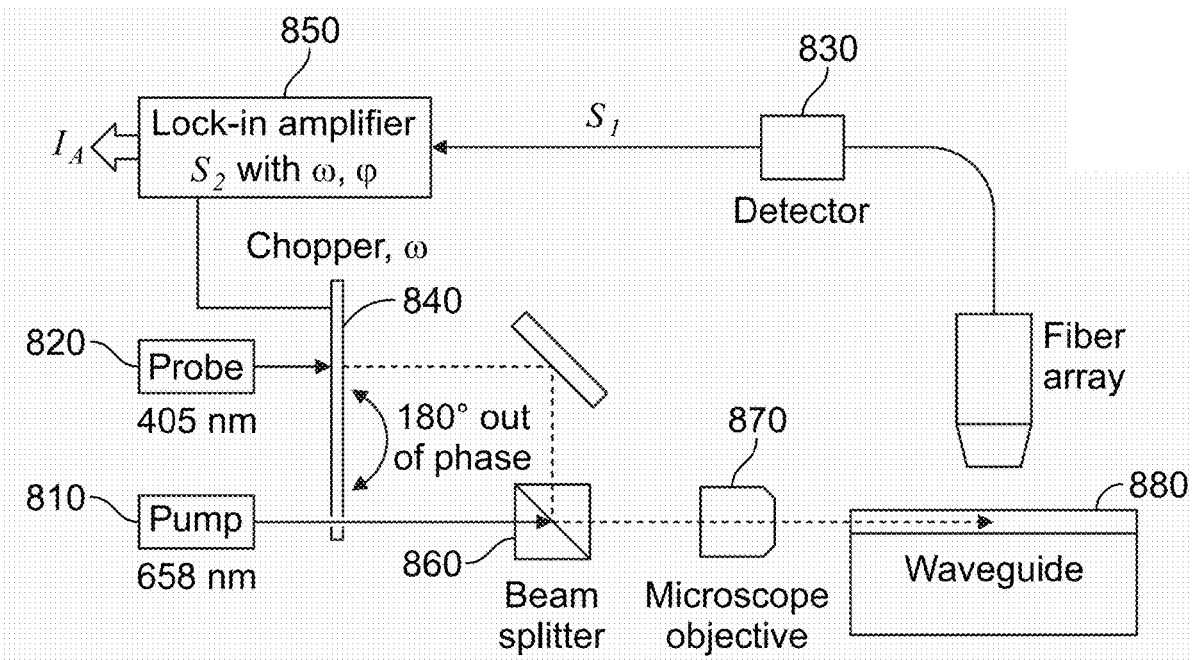
FIG. 8A is a schematic illustration of the measurement setup for luminescent thermometry.

FIG. 8A is a schematic illustration of the measurement setup for the luminescent thermometry of the present invention. Components include pump laser 810 at 658 nm for pumping and probe laser 820 at 405 nm for probing. Also included are a photodetector 830, chopper 840, and lock-in amplifier 850. Probing and pumping laser beams are combined by dichroic beam-splitter 860 and coupled into waveguide 880 by objective 870. Probing and pumping lasers are modulated by chopper 840 in such a way that they exhibit 180-degree phase shift (one is on when the other is off). Filters block pumping and probing light and allow predominantly fluorescence and anti-Stokes emission collection.

Figure 8B:
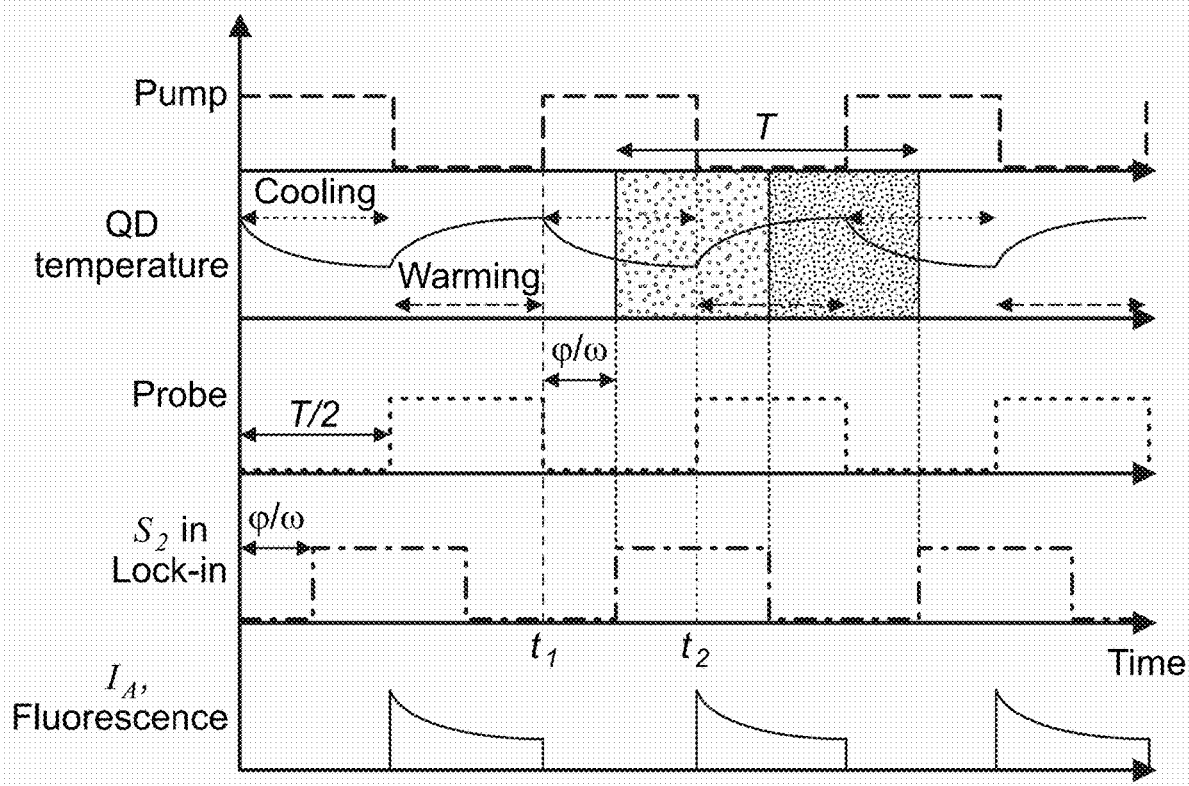
FIG. 8B is a plot of a signal for various components vs. time.

FIG. 8B represents signal plots vs time of the pump laser, QD temperature, probe laser, reference of the lock-in amplifier, and measured fluorescence/anti-Stokes emission vs. time.

When the cooling by anti-Stokes effects begins with the QDs at the middle of the core, induced by the pumping starting at the time $t_1$ (the first row in FIG. 8B), the temperature of the sample drops down (the second row in FIG. 8B). At time $t_2$, when the pumping laser is off, the cooling process is terminated and the sample starts to warm due to heat transfer from the environment. At that moment, the probing laser is on (the third row in FIG. 8B) and the fluorescence can be measured. The fluorescence intensity decreases with increasing temperature as shown in FIG. 3B. The probing and pumping lasers cannot be turned on together because of the fluorescence and anti-Stokes emission interference.

The slope of the fluorescence signal is related to the temperature change in the waveguide: negative slope corresponds to cooling by the pump and then warming due to the environment (the fifth row in FIG. 8B). In the case of the laser warming effect, the graph would be the opposite: a positive slope would indicate warming by the pump and then cooling due to the environment. Note, that the QD temperature signal and the corresponding fluorescence signal are shifted by a half period (T/2) relative to the probe signal, which means that the pump and fluorescent signals should be 90-degree shifted in phase.

Lock-in amplifier 850 was used to determine such a phase change of the fluorescence signal relative to the original probe signal. The signal collected by the detector, $S_1=A_1 \sin(\omega t+\varphi)$, can be written as $$S_1 = P_{s,pump} + P_{s,probe} + S_w, \quad (1)$$

where $P_{s,pump}$ and $P_{s,probe}$ are the measured scattered powers from the pump and probe lasers in the setup, respectively, and $S_w$ is the fluorescence in the waveguide. The $P_{s,pump}$ and $P_{s,probe}$ are greatly attenuated by a band-pass filter to increase portion of $S_w$ collected by the photodetector. The reference signal $S_2$ that the chopper generates for the lock-in amplifier with the angular frequency wand the phase shift set equal to zero can be written as $S_2=A_2 \sin(\omega t)$. Ultimately, lock-in amplifier 850 measures the autocorrelation, A, expressed as $$A = |A| \cdot \exp(i\varphi) \propto \int_t^{t+T} S_1 \cdot S_2 dt' \sim \int_t^{t+T} S_w \cdot S_2 dt' \quad (2)$$

In general A is a complex number which is proportional to the amplitude of signal $S_w$ and indicating its phase shift $\varphi$. The amplitude of $S_w$ reflects the decay rate of the fluorescence that includes the information on cooling and warming rates of the given nanoemitters, directly related to anti-Stokes effects for laser cooling. In the Fourier transform of the fluorescence intensity decreasing with time (corresponds to laser cooling when the pump laser is on and to sample warming when the pump laser is off) as predicted in FIG. 5B, $\varphi$ in Eq. (2) measured by the lock-in amplifier must be negative. In contrast, the fluorescence intensity increasing with time (corresponds to laser warming when the pump laser is on and to sample cooling when the pump laser is off) would induce positive $\varphi$.

Figure 9:
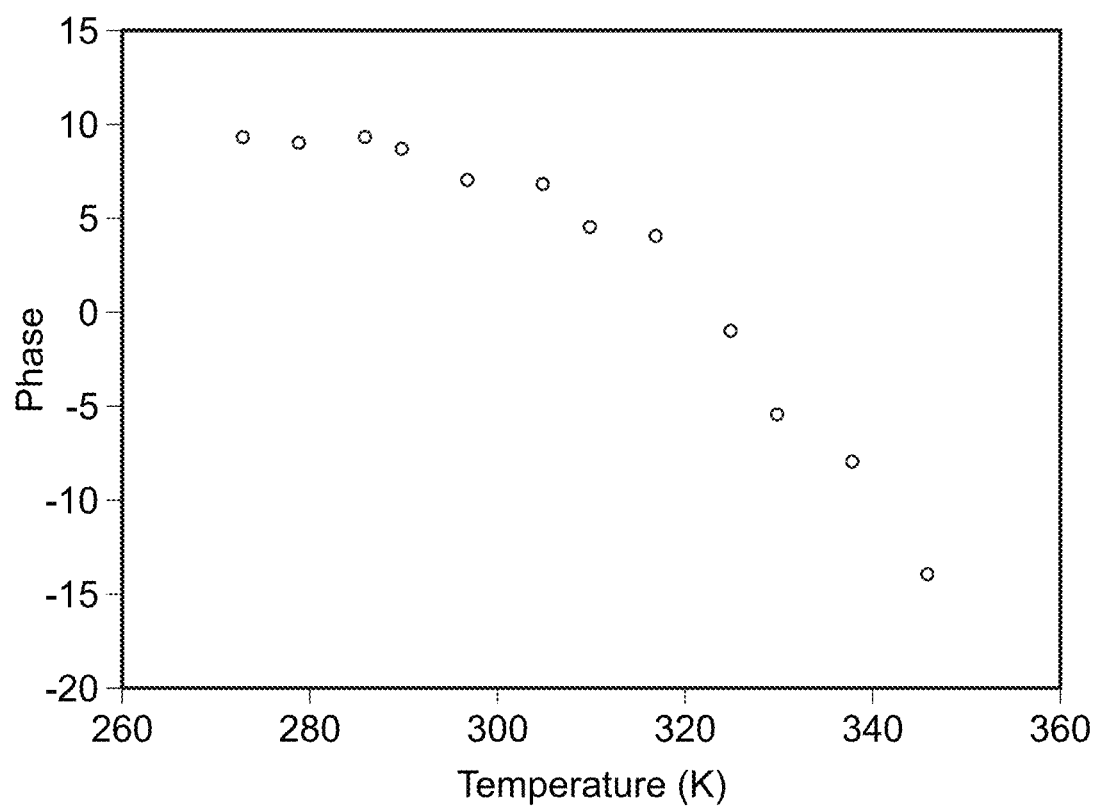
FIG. 9 illustrates photoluminescence thermometry signal phase change with ambient temperature.

The evidence of optical cooling at elevated temperatures of the waveguide, is consistent with the strong temperature dependence of anti-Stokes photoluminescence as shown in FIG. 3C. The phase $\varphi$ change with increasing temperature of the waveguide environment from 270 K to 350 K was registered. This dependence is shown in FIG. 9.

Phase $\varphi$ changing sign at the temperature about 320 K was observed which is direct evidence of local optical cooling. The physical mechanism can be explained in the following way. As can be seen in FIG. 3C, the PL peak occurs at 630 nm. The pump laser available for the experiments emitted at 656 nm. This corresponds to 0.078 eV anti-Stokes shift. Since the thermal energy kT at room temperature of 25.7 meV was much smaller than the anti-Stokes shift of 78 meV, the efficiency of phonon-exciton coupling was very low and insufficient for laser cooling. That problem was solved by heating the waveguide environment to the temperature above 320 K, matching kT with the anti-Stokes shift. This allowed phonon-exciton coupling to be enhanced and laser cooling to be observed.

The strong temperature dependence of anti-Stokes PL shown in FIG. 3C is consistent with the predicted enhancement of anti-Stokes PL with increasing temperature. Near-unity quantum efficiency of QDs is the necessary condition for laser cooling. The room-temperature quantum efficiency of CdSeS/ZnS QDs over 50% for UV excitation was reported. Moreover, a ~1.5 to ~2 times increase in quantum efficiency has recently been reported in CdSe/CdS QDs with the excitation wavelength increasing from UV to Vis. These observations combined with the strong temperature enhancement of anti-Stokes PL (FIG. 3C), make near-unity quantum efficiency of CdSeS/ZnS QDs excited at 658 nm at the waveguide temperatures higher than 320 K a reasonable assumption.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above-described embodiments, methods, and examples, but by all embodiments and methods within the scope and spirit of the disclosure.

What is claimed is:

1. A semiconductor device comprising a waveguide having a core, made of silicon nitride, sandwiched in between two opposingly located cladding layers, made of aluminum nitride; said core having inserted therein one or more layers of nanoemitters, wherein said nanoemitters, when excited with emission at certain wavelength, produce photoluminescence such that the short-wavelength anti-Stokes photoluminescence prevails over the long-wavelength Stokes photoluminescence.

2. The semiconductor device of claim 1, wherein said nanoemitters are quantum dots.

3. The semiconductor device of claim 2, wherein said quantum dots are made of CdSeS/ZnS.

4. The semiconductor device of claim 2, wherein said quantum dots are made from InP, CdSe, CdTe, PbS, and PbSe.

5. The semiconductor device of claim 1, wherein said nanoemitters are quantum wells.

6. The semiconductor device of claim 1, wherein said nanoemitters are quantum wires.

7. The semiconductor device of claim 1 further including a plurality of waveguides in contact with one or more layers of active electronic components; said plurality of waveguides are configured into one or more three-dimensional stacks of optically cooling planes with layers of active electronic components being cooled in between.

8. The semiconductor device of claim 1 further including a plurality of optical waveguides in contact with one or more layers of active electronic components; said optical waveguide of claim 1 implemented in a two-dimensional photonic-crystal waveguide platform as a slab photonic-crystal waveguide; said plurality of optical waveguides implemented in a plurality of two-dimensional photonic-crystal waveguide platforms; and said plurality of two-dimensional photonic-crystal waveguides arranged as three-dimensional stacks of photonic-crystal optically cooling planes with layers of active electronic components being cooled in between.

* * * * *